(12) United States Patent
Yang

(10) Patent No.: US 11,289,382 B2
(45) Date of Patent: Mar. 29, 2022

(54) METHOD FOR FORMING TRANSISTOR WITH STRAINED CHANNEL

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/121,767

(22) Filed: Dec. 15, 2020

(65) Prior Publication Data

US 2021/0143067 A1 May 13, 2021

Related U.S. Application Data

(62) Division of application No. 16/261,494, filed on Jan. 29, 2019, now Pat. No. 10,903,125.

(30) Foreign Application Priority Data

Jan. 14, 2019 (CN) .......................... 201910030931.9

(51) Int. Cl.
*H01L 21/8238* (2006.01)
*H01L 27/092* (2006.01)
*H01L 21/306* (2006.01)
*H01L 21/3065* (2006.01)

(52) U.S. Cl.
CPC ........... *H01L 21/823814* (2013.01); *H01L 21/823807* (2013.01); *H01L 27/0925* (2013.01); *H01L 21/3065* (2013.01); *H01L 21/30604* (2013.01)

(58) Field of Classification Search
CPC ..... H01L 21/823814; H01L 21/823807; H01L 21/30604; H01L 21/3065; H01L 21/823828; H01L 27/0925; H01L 27/092; H01L 29/7842; H01L 29/66477; H01L 29/66545; H01L 29/7849
USPC ........................................................ 257/192
See application file for complete search history.

(56) References Cited

U.S. PATENT DOCUMENTS

| 9,954,052 B2* | 4/2018 | Lee ................ H01L 21/823807 |
| 2009/0085125 A1* | 4/2009 | Kim .................... H01L 29/7848 257/369 |
| 2011/0042758 A1* | 2/2011 | Kikuchi .............. H01L 29/1054 257/408 |
| 2011/0054258 A1 | 3/2011 | O'Keefe |
| 2013/0240956 A1 | 9/2013 | Hou |

(Continued)

*Primary Examiner* — Dao H Nguyen
(74) *Attorney, Agent, or Firm* — Winston Hsu

(57) ABSTRACT

A method of forming a semiconductor structure. A first sacrificial gate is formed on a substrate. A spacer is formed on a sidewall of the first sacrificial gate. In the substrate, adjacent to the first sacrificial gate, a source region and a drain region are formed. A channel region is formed between the source region and the drain region. The first sacrificial gate is removed, and a gate trench is formed on the channel region between the spacers. The substrate is etched via the gate trench, thereby forming a recessed trench between the source region and the drain region, and extending into the substrate. The recessed trench has a hexagonal cross-sectional profile. A stress inducing material layer is then formed in the recessed trench. A channel layer is epitaxially grown on the stress inducing material layer. A gate structure is formed on the channel layer.

8 Claims, 4 Drawing Sheets

(56) References Cited

U.S. PATENT DOCUMENTS

2013/0270628 A1\* 10/2013 Huang ................ H01L 29/1037
257/329
2017/0352741 A1\* 12/2017 Zhang ............... H01L 21/26586

\* cited by examiner

METHOD FOR FORMING TRANSISTOR WITH STRAINED CHANNEL

CROSS REFERENCE TO RELATED APPLICATIONS

This application is a division of U.S. application Ser. No. 16/261,494 filed Jan. 29, 2019, which is included in its entirety herein by reference.

BACKGROUND OF THE INVENTION

1. Field of the Invention

The present invention relates to the field of semiconductor process technology, and more particularly to a transistor having a strained channel and a method of fabricating the same.

2. Description of the Prior Art

It is known that providing different types of stress in the structure of a transistor can increase the mobility of charge carriers in the channel region. For example, providing tensile stress to the channel region can increase electron mobility, thereby increasing conductivity and increasing operating speed. Providing compressive stress on the channel region increases the hole mobility, thereby enhancing the performance of the transistor.

Generally, for N-type transistors, compressive stress is introduced into the channel region, and for P-type transistors, tensile stress is introduced into the channel region. Various structures have been proposed in the prior art to introduce stresses in their respective channel regions, however prior art techniques may have misalignment problems.

SUMMARY OF THE INVENTION

The present invention provides an improved semiconductor structure and a method of fabricating the same, which can effectively introduce compressive stress into channel region of an N-type transistor, and introduce tensile stress into channel region of a P-type transistor without misalignment problems.

One aspect of the invention provides a method of forming a semiconductor structure. A substrate is first provided having an upper surface. A first sacrificial gate is formed on the substrate. A spacer is formed on a sidewall of the first sacrificial gate. In the substrate, adjacent to the first sacrificial gate, a source region and a drain region are formed. A channel region is formed between the source region and the drain region. A stop layer is formed on the substrate, wherein the stop layer conformally covers the spacer, the first sacrificial gate, the source region, and the drain region. The first sacrificial gate is removed, and a gate trench is formed on the channel region between the spacers. The substrate is then etched via the gate trench, thereby forming a recessed trench between the source region and the drain region, and extending into the substrate from the upper surface of the substrate. The recessed trench has a hexagonal cross-sectional profile. A stress inducing material layer is then formed in the recessed trench. A channel layer is epitaxially grown on the stress inducing material layer. A gate structure is formed on the channel layer.

Another aspect of the invention provides a semiconductor device comprising: a substrate having an upper surface; a source region disposed in the substrate; a drain region disposed in the substrate; and a recessed trench interposed between the source region and the drain region, extending from the upper surface of the substrate into the substrate. The recessed trench has a hexagonal cross-sectional profile. A stress inducing material layer is disposed in the recessed trench. A channel layer is disposed on the stress inducing material layer. A gate structure is disposed on the channel layer.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
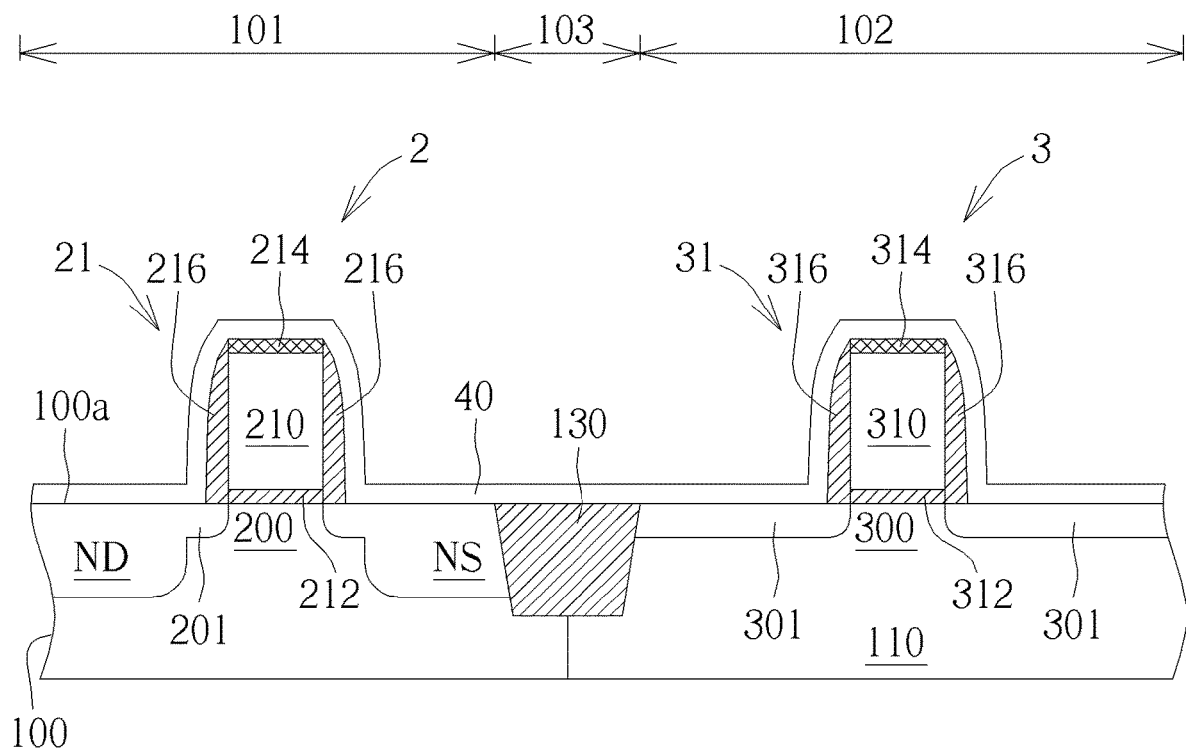
FIG. 1 to FIG. 7 are schematic cross-sectional views showing a method of forming a semiconductor structure according to an embodiment of the invention.

Please refer to FIG. 1 to FIG. 7, which are schematic cross-sectional views showing a method of forming a semiconductor structure according to an embodiment of the invention. As shown in FIG. 1, first, a substrate 100, for example, a P-type silicon substrate is provided, but is not limited thereto. The substrate 100 may include an NMOS region 101, a PMOS region 102, and an isolation region 103. A trench isolation structure 130 is formed in the isolation region 103 for isolating the NMOS region 101 from the PMOS region 102. The substrate 100 includes an upper surface 100a. An N well 110 may be formed in the PMOS region 102.

In accordance with an embodiment of the invention, an NMOS transistor 2 is formed within NMOS region 101, including a sacrificial gate 21, such as a polysilicon gate. For example, the sacrificial gate 21 may include a polysilicon layer 210, a gate dielectric layer 212, and a silicon nitride cap layer 214, but is not limited thereto. A spacer 216 may be provided on each sidewall of the sacrificial gate 21, for example, a silicon nitride spacer, but is not limited thereto. In the substrate 100, adjacent to the sacrificial gate 21, a source region NS and a drain region ND are formed.

According to an embodiment of the invention, the source region NS and the drain region ND may be N-type heavily doped regions. In addition, the source region NS and the drain region ND may further include an N-type lightly doped drain (NLDD) region 201 located directly under the spacer 216. According to an embodiment of the invention, a channel region 200 is formed between the source region NS and the drain region ND.

In accordance with an embodiment of the invention, a PMOS transistor 3 is formed within PMOS region 102, including a sacrificial gate 31, such as a polysilicon gate. For example, the sacrificial gate 31 may include a polysilicon layer 310, a gate dielectric layer 312, and a silicon nitride cap layer 314. A spacer 316 may be provided on each sidewall of the sacrificial gate 31, for example, a silicon nitride spacer, but is not limited thereto. In the substrate 100, adjacent to the sacrificial gate 31, a P-type lightly doped drain (PLDD) region 301 is further formed. A channel region 300 is disposed directly beneath the sacrificial gate 31 between the PLDD regions 301.

Next, a stop layer 40, for example, a silicon nitride layer, is formed on the substrate 100 to serve as an etch stop layer. The stop layer 40 conformally covers the NMOS region 101, the PMOS region 102, and the isolation region 103. For example, in the NMOS region 101, the stop layer 40 conformally covers the spacer 216, the sacrificial gate 21, the source region NS, and the drain region ND. Within PMOS region 102, the stop layer 40 conformally covers the spacer 316, the sacrificial gate 31, and the PLDD region 301.

Figure 2:
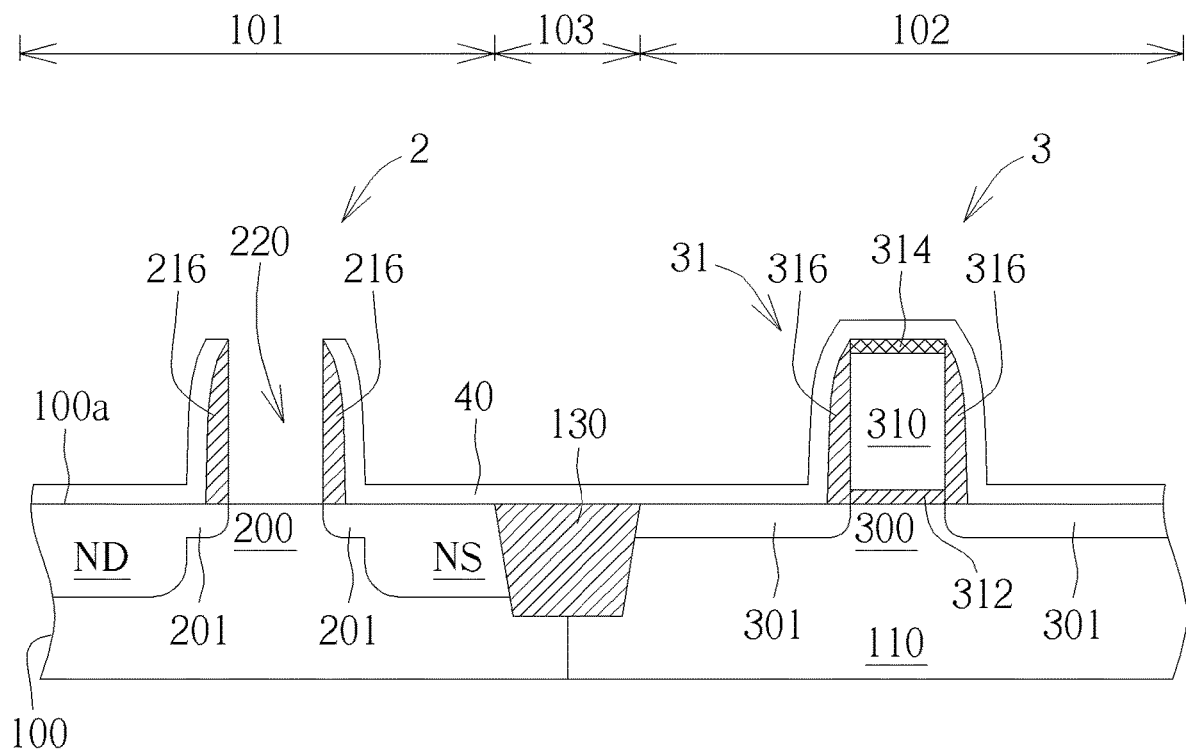

As shown in FIG. 2, a lithography process and an etch process can be performed to remove the sacrificial gate 21, and a gate trench 220 is formed on the channel region 200 between the spacers 216. For example, a photoresist pattern (not shown) is formed on the stop layer 40, and has an opening directly above the sacrificial gate 21. Then, the stop layer 40 and the sacrificial gate 21 are etched away through the opening, and the polysilicon layer. 210, the gate dielectric layer 212 and the silicon nitride cap layer 214 are removed, thereby forming a gate trench 220 that reveals the channel region 200. The aforesaid photoresist pattern is then removed.

Figure 3:
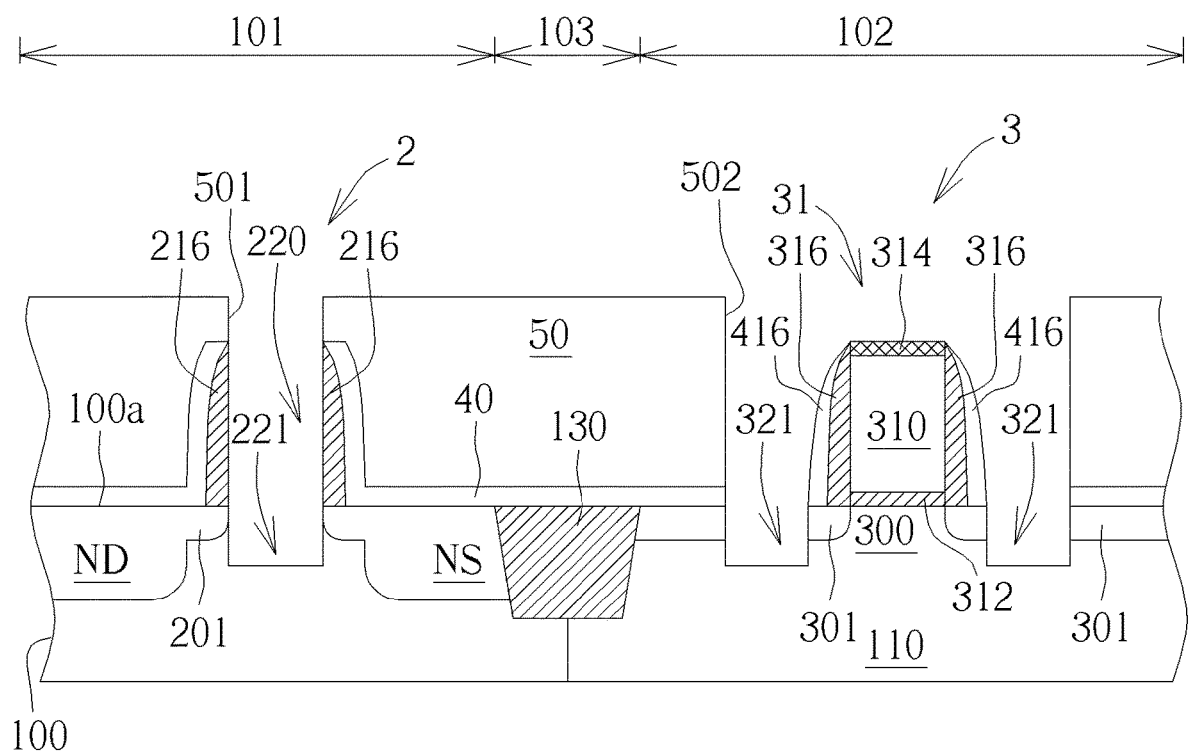

As shown in FIG. 3, a photoresist pattern 50 is formed on the substrate 10 to cover the NMOS region 101, the PMOS region 102, and the isolation region 103. The photoresist pattern 50 includes an opening 501 in the NMOS region 101. The opening 501 is aligned with the gate trench 220. The photoresist pattern 50 further includes an opening 502 in the PMOS region 102 to expose the sacrificial gate 31 of the PMOS transistor 3 and at least a portion of the PLDD region 301 adjacent to the sacrificial gate 31.

Subsequently, an anisotropic dry etching process is performed and the substrate 100 is etched through the opening 501 and the gate trench 220 to thereby form a recessed trench 221 between the source region NS and the drain region ND. Concurrently, the substrate 100 is etched through the opening 502 to form recesses 321 adjacent to the sacrificial gate 31. The recessed trench 221 and the recesses 321 extend from the upper surface 100a of the substrate 100 into the substrate 100 to a first predetermined depth. Next, the photoresist pattern 50 is removed. The aforesaid anisotropic dry etching process etches the stop layer 40 via the opening 502 to form second spacers 416.

Figure 4:
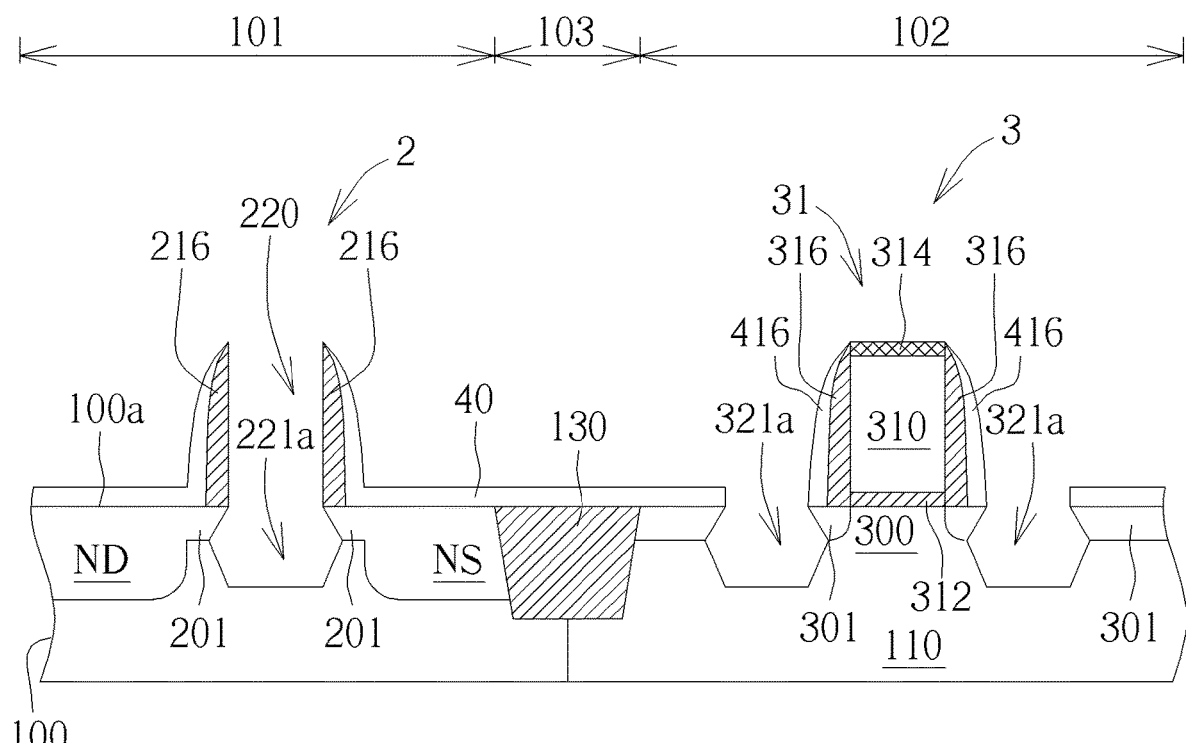

Subsequently, as shown in FIG. 4, a wet etching process is performed to continue etching the recessed trench 221 and the recesses 321 to form a widened recessed trench 221a and widened recesses 321a. The wet etching process described above may involve the use of hydroxyl (OH) containing materials including, but not limited to, potassium hydroxide, tetramethylammonium hydroxide (TMAH) or sodium hydroxide. The recessed trench 221a and the recesses 321a extend from the upper surface 100a of the substrate 100 into the substrate 100 to a second predetermined depth. According to an embodiment of the invention, the second predetermined depth is not deeper than the bottommost junction of the source region NS and the drain region ND. According to an embodiment of the invention, the recessed trench 221a and the recesses 321a may have a hexagonal cross-sectional profile.

Figure 5:
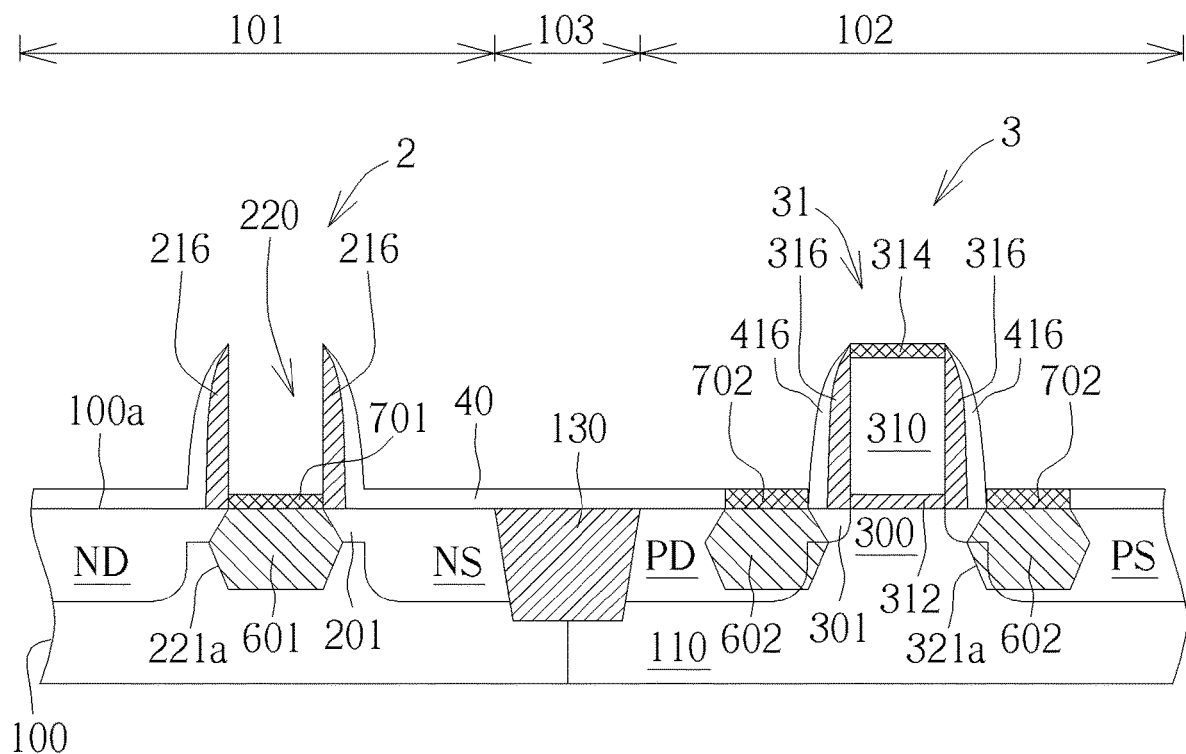

As shown in FIG. 5, a stress inducing material layer 601 is formed in the recessed trench 221a, and a stress inducing material layer 602 is formed in the recesses 321a. According to an embodiment of the invention, the stress inducing material layers 601, 602 may comprise a silicon germanium (SiGe) layer. The stress inducing material layers 601, 602 may be formed by a selective epitaxial method, but are not limited thereto.

Then, an epitaxial process is performed, and an epitaxial silicon layer 701 and an epitaxial silicon layer 702 are respectively epitaxially grown on the stress inducing material layer 601 and the stress inducing material layer 602. The epitaxial silicon layer 701 is a crystalline silicon layer, which can be used as a channel layer of the NMOS transistor 2. The epitaxial silicon layer 702 is a part of the source/drain structure of the PMOS transistor 3.

Subsequently, an ion implantation process for forming heavily doped source/drain is then performed to form the source region PS and the drain region PD in the PMOS region 102. For example, the source region PS and the drain region PD may be P-type heavily doped regions.

Figure 6:
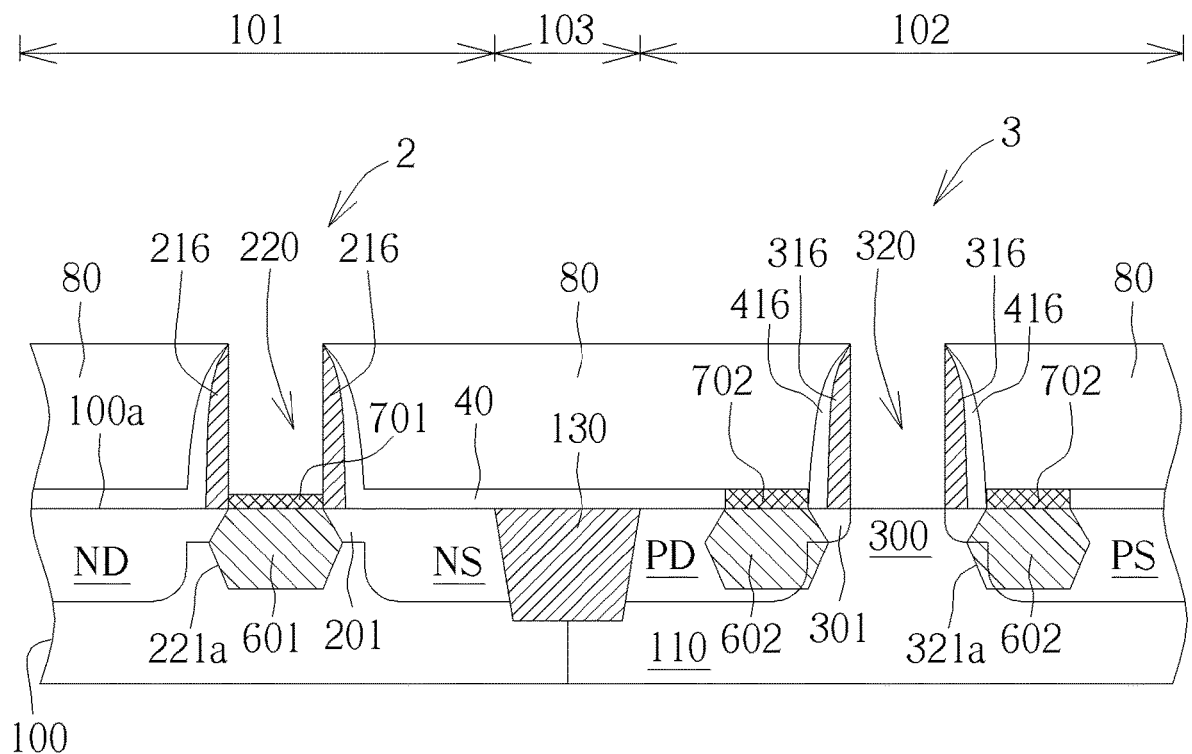

As shown in FIG. 6, a chemical vapor deposition (CVD) process is then performed to blanket deposit an interlayer dielectric (ILD) layer 80, such as a silicon oxide layer or a low dielectric constant material layer. The interlayer dielectric layer 80 covers the stop layer 40 and the sacrificial gate 31 and the epitaxial silicon layer 702 in the PMOS region 102. The gate trench 220 is filled with the interlayer dielectric layer 80. The interlayer dielectric layer 80 may be subjected to a planarization process, such as a chemical mechanical polishing (CMP) process.

Subsequently, a lithography process and an etching process can be performed to remove the interlayer dielectric layer 80 from the gate trench 220 to expose the epitaxial silicon layer 701 (channel layer), and at the same time, the sacrificial gate 31 is removed to form a gate trench 320 that reveals the channel region 300.

Figure 7:
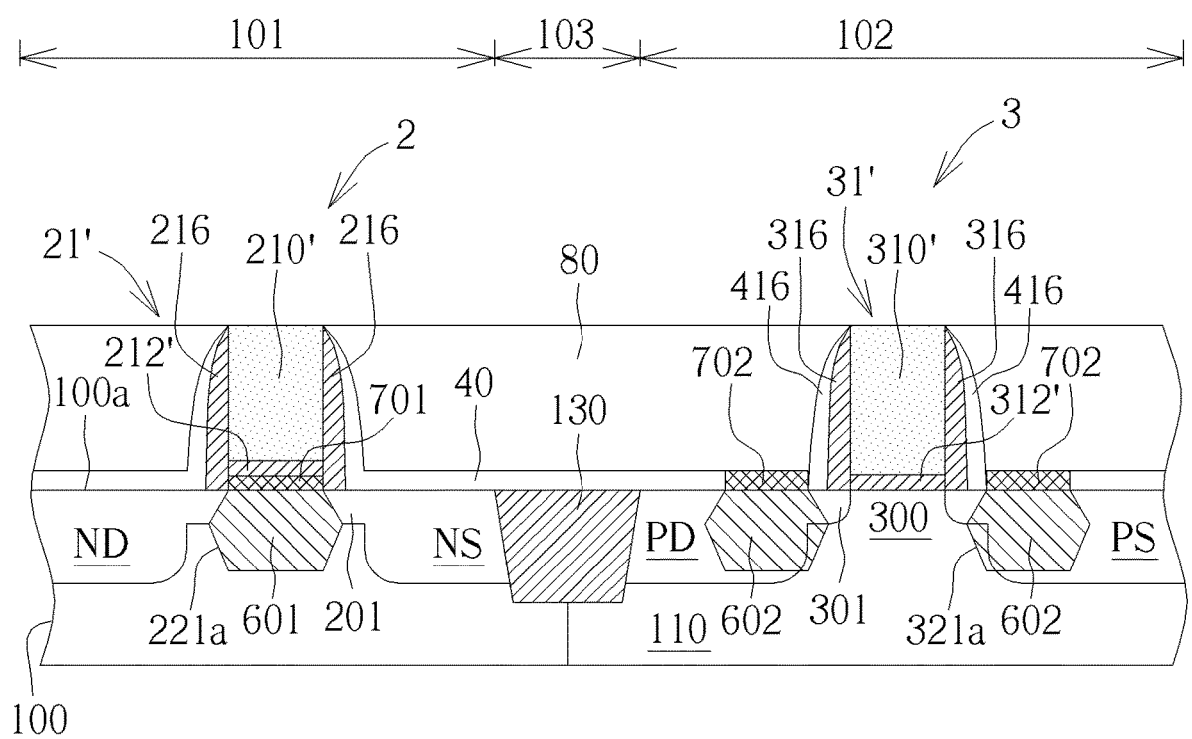

As shown in FIG. 7, a metal gate structure 21' is formed on the epitaxial silicon layer 701 (channel layer) in the gate trench 220, and a metal gate structure 31' is formed on the channel region 300 in the gate trench 320. According to an embodiment of the invention, the metal gate structure 21' may include a metal layer 210' and a gate dielectric layer 212'. The metal gate structure 31' may include a metal layer 310' and a gate dielectric layer 312', but not limited to this. It should be understood that the metal gate structure 21' and the metal gate structure 31' in FIG. 7 are merely illustrative. In other embodiments, the metal gate structure 21' and the metal gate structure 31' may have different structures.

Structurally, for example, as shown in FIG. 7, the NMOS transistor 2 includes a substrate 100 having an upper surface 100a, a source region NS disposed in the substrate 100, and a drain region ND disposed on the substrate 100. A recessed trench 221a is disposed between the source region NS and the drain region ND extending from the upper surface 100a of the substrate 100 into the substrate 100 to a predetermined depth. The recessed trench 221a has a hexagonal cross-sectional profile. A stress inducing material layer 601 is disposed in the recessed trench 221a. A channel layer 701 is disposed on the stress inducing material layer 601. A metal gate structure 21' is disposed on the channel layer 701. The substrate 100 is a P-type substrate, and the source region NS and the drain region ND are both N-type doped regions.

The NMOS transistor 2 further includes a spacer 216 disposed on the sidewall of the metal gate structure 21'. The NMOS transistor 2 further includes a stop layer 40 on the substrate 100, wherein the stop layer 40 conformally covers the spacer 216, the source region NS and the drain region ND. According to an embodiment of the invention, the stop layer 40 comprises a silicon nitride layer, the stress inducing material layer 601 comprises a silicon germanium layer, and the channel layer 701 comprises a crystalline silicon layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:

providing a substrate having a top surface, the substrate comprising an NMOS region and a PMOS region;

forming a first sacrificial gate within the NMOS region and a second sacrificial gate within the PMOS region on the substrate;

forming spacers on sidewalls of the first sacrificial gate and the second sacrificial gate;

forming an N-type source region and an N-type drain region within the NMOS region in the substrate and adjacent to the first sacrificial gate;

forming a channel region between the N-type source region and the N-type drain region;

removing the first sacrificial gate, thereby forming a gate trench between the spacers and above the channel region;

etching the substrate through the gate trench to form a recessed trench extending from the top surface into the substrate and between the source region and the drain region, wherein the recessed trench has a hexagonal cross-sectional profile;

forming a recess in the substrate adjacent to the second sacrificial gate, wherein the recessed trench and the recess are formed simultaneously;

forming a stress-inducing material layer in the recessed trench within the NMOS region;

epitaxially growing a channel layer on the stress-inducing material layer within the NMOS region; and forming a gate structure on the channel layer in the gate trench within the NMOS region.

2. The method according to claim 1, wherein the substrate is a P-type substrate.

3. The method according to claim 1, wherein the sacrificial gate comprises a polysilicon gate.

4. The method according to claim 1, wherein after forming the channel region between the N-type source region and the N-type drain region, the method further comprises:

forming a stop layer on the substrate, wherein the stop layer conformally covers the spacers, the first sacrificial gate, the N-type source region, the N-type drain region, and the second sacrificial gate.

5. The method according to claim 4, wherein the stop layer comprises a silicon nitride layer.

6. The method according to claim 4, wherein the method further comprising:

blanket depositing an inter-layer dielectric (ILD) layer after epitaxially growing the channel layer on the stress-inducing material layer, wherein the ILD layer covers the stop layer and fills into the gate trench; and removing the ILD layer from the gate trench to expose the channel layer.

7. The method according to claim 1, wherein the stress-inducing material layer comprising a SiGe layer.

8. The method according to claim 1, wherein the channel layer comprises a crystalline silicon layer.

* * * * *